(12) United States Patent
Pomarico et al.

(10) Patent No.: US 11,851,319 B2
(45) Date of Patent: Dec. 26, 2023

(54) HIGH-RANGE SEMICONDUCTOR LOAD SENSOR DEVICE

(71) Applicant: STMicroelectronics S.r.l., Agrate Brianza (IT)

(72) Inventors: Anna Angela Pomarico, San Cesario Lecce (IT); Giuditta Roselli, Lecce (IT); Daniele Caltabiano, Agrate Brianza (IT); Roberto Brioschi, Sesto San Giovanni (IT); Mohammad Abbasi Gavarti, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 897 days.

(21) Appl. No.: 16/560,518

(22) Filed: Sep. 4, 2019

(65) Prior Publication Data
US 2020/0095114 A1 Mar. 26, 2020

(30) Foreign Application Priority Data
Sep. 20, 2018 (IT) .......... 102018000008777

(51) Int. Cl.
*B81B 3/00* (2006.01)
*B60T 1/06* (2006.01)
(Continued)

(52) U.S. Cl.
CPC ............ *B81B 3/0072* (2013.01); *B60T 1/065* (2013.01); *B60T 8/17* (2013.01); *B60T 8/171* (2013.01);
(Continued)

(58) Field of Classification Search
CPC .......... B81B 3/0072; B81B 2203/0127; B81B 2203/0315; B71B 2201/0264;
(Continued)

(56) References Cited

U.S. PATENT DOCUMENTS 5,760,313 A * 6/1998 Guentner .............. G01L 1/2237
73/862.635
5,915,281 A * 6/1999 Sparks .................. G01L 9/0052
73/862.581
(Continued)

FOREIGN PATENT DOCUMENTS

GB 1530711 A 11/1978
JP 2016217804 A * 12/2016 .............. B81B 3/00
(Continued)

*Primary Examiner* — Vishal R Sahni
(74) *Attorney, Agent, or Firm* — Slater Matsil, LLP

(57) ABSTRACT

A device includes: a micromechanical sensing structure configured to provide an electrical detection quantity as a function of a load; and a package enclosing the micromechanical sensing structure and providing a mechanical and electrical interface with respect to an external environment. The package includes a housing structure defining a cavity housing the micromechanical sensing structure; and a package coating that coats, at least in part, the housing structure, the package coating including a mechanical interface configured to transfer, in a uniform manner, the load on the housing structure and on the micromechanical sensing structure, wherein the housing structure includes a deformable layer interposed and in contact between the micromechanical sensing structure and the package coating, and wherein the deformable layer defines a mechanical-coupling interface.

20 Claims, 6 Drawing Sheets

(51) Int. Cl.
  *B60T 8/17*   (2006.01)
  *B60T 8/171*  (2006.01)
  *G01L 1/18*   (2006.01)
  *G01L 3/00*   (2006.01)
  *G01L 9/06*   (2006.01)

(52) U.S. Cl.
  CPC .............. *G01L 1/18* (2013.01); *G01L 3/00* (2013.01); *G01L 9/06* (2013.01); *B81B 2201/0264* (2013.01); *B81B 2201/0292* (2013.01); *B81B 2203/0127* (2013.01); *B81B 2203/0315* (2013.01)

(58) Field of Classification Search
  CPC ... B71B 2201/0292; B60T 1/06; B60T 8/171; B60T 8/17; G01L 1/18; G01L 9/06; G01L 3/00
  See application file for complete search history.

(56) References Cited

U.S. PATENT DOCUMENTS

| | | | | |
|---|---|---|---|---|
| 6,351,996 | B1* | 3/2002 | Nasiri | G01L 19/0084 73/706 |
| 7,578,196 | B2* | 8/2009 | Riccoti | G01L 9/0045 73/754 |
| 9,201,105 | B2* | 12/2015 | Iida | G06F 3/0447 |
| 9,457,786 | B2* | 10/2016 | Baumgartner | G01L 5/28 |
| 2008/0196491 | A1* | 8/2008 | Ricotti | G01L 1/18 73/132 |
| 2009/0235760 | A1* | 9/2009 | Hayakawa | G01L 1/20 73/862.046 |
| 2014/0238131 | A1* | 8/2014 | Yoshiuchi | G01C 19/5769 73/514.16 |
| 2015/0008800 | A1 | 1/2015 | Freshour | |
| 2015/0362389 | A1 | 12/2015 | Yanev et al. | |
| 2016/0349129 | A1* | 12/2016 | Pagani | G01L 9/0045 |
| 2017/0199090 | A1* | 7/2017 | Anan | G01L 1/18 |
| 2017/0233245 | A1* | 8/2017 | Duqi | B81B 7/0041 257/419 |
| 2017/0343430 | A1* | 11/2017 | Caltabiano | G01L 1/04 |

FOREIGN PATENT DOCUMENTS

| | | | | |
|---|---|---|---|---|
| WO | WO-2007010570 | A1 * | 1/2007 | ............ G01L 15/00 |
| WO | WO-2019167688 | A1 * | 9/2019 | |

* cited by examiner

HIGH-RANGE SEMICONDUCTOR LOAD SENSOR DEVICE

CROSS-REFERENCE TO RELATED APPLICATIONS

This application claims priority to Italian Patent Application No. 102018000008777, filed on Sep. 20, 2018, which application is hereby incorporated herein by reference.

TECHNICAL FIELD

The present solution relates to a high-range packaged semiconductor load sensor device, in particular for measurements of force, pressure, or torque.

BACKGROUND

Techniques of microfabrication of semiconductor devices enable the manufacturing of micromechanical load-sensing structures (where this term is used to generically mean a force, a pressure, or a torque) in dies of semiconductor material.

Such micromechanical sensing structures are provided in layers of semiconductor material, in which sensing elements are formed, for example piezoresistors, adapted to deform upon application of the load thus generating a variation of electrical signal according to the same load.

The sensing elements may, for example, be provided in a membrane, configured to deform as a result of the load applied, or else, especially in the case of high-range applications (i.e., applications designed for detecting high values of load, for example of the order of 10 kN), in a surface portion of a compact and monolithic body (the so-called bulk) of semiconductor material.

Alternatively, load measurement may be implemented by the capacitive technique. In this case, the membrane (or other element subject to deformations) is coupled to a fixed part of the die so as to form a capacitor element with a capacitance that is variable according to the applied load.

The micromechanical sensing structure, integrated in the corresponding die, is in any case enclosed in a container or package having the purpose of protecting the internal structures from the external environment, for example in order to reduce disturbances due to temperature, humidity, or contaminating particles, increase the mechanical strength and, moreover, provide an appropriate electrical connection interface with respect to external electronic systems (which receive the electrical quantities transduced by the micromechanical sensing structure for further processing or uses).

The resulting MEMS (Micro-Electro-Mechanical System) sensor devices hence includes a micromechanical sensing structure, provided in one or more dice made of semiconductor material, packaged in a respective package. Inside the same package also an electronic interface circuit, or ASIC (Application Specific Integrated Circuit) may possibly be integrated, which may be provided in a different die of semiconductor material, which is also housed in the package, appropriately coupled electrically to the micromechanical sensing structure.

An important problem that affects high-range load sensor devices is linked to correct application of the load to the micromechanical sensing structure, through the corresponding package, so as to prevent local concentrations of force that could reduce both measurement accuracy and the maximum load that can be applied (so as not to cause damage or failure). Basically, it is required for the load to be applied in a uniform and homogeneous way.

In general, the package may moreover cause stresses that adversely affect the performance, stability, and reliability of the sensor device. This is particularly disadvantageous for load sensors, for example those based on the piezoresistive characteristics of silicon, where the stresses are directly involved in the transduction mechanism. These stresses may be caused, for example, by use of packaging materials with different thermal expansion coefficients, with undesirable deformations that may arise as a result of the variation in the working temperature, due to thermal soldering processes or to ageing of the materials.

SUMMARY

The object of the present disclosure is to provide a solution that will enable the drawbacks of the prior art to be overcome, in particular an improved solution for packaging a semiconductor load sensor device.

BRIEF DESCRIPTION OF THE DRAWINGS

For a better understanding of the present invention, preferred embodiments thereof are now described, purely by way of non-limiting example, with reference to the attached drawings, wherein.

DETAILED DESCRIPTION OF ILLUSTRATIVE EMBODIMENTS

Figure 1:
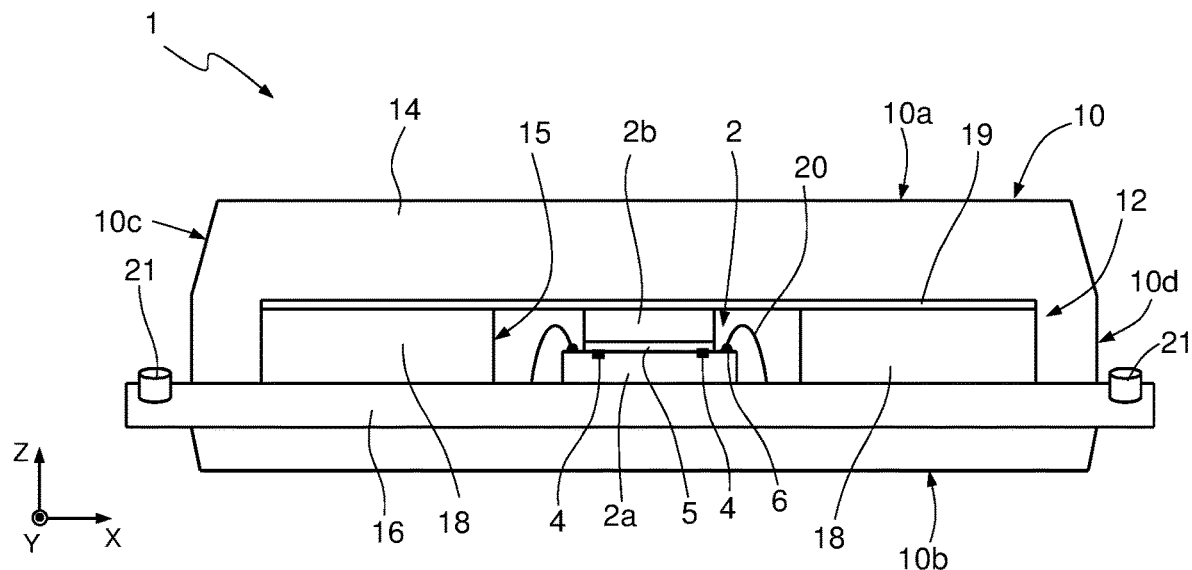
FIG. 1 is a cross-section of a high-range semiconductor load sensor device, according to a first embodiment of the present solution.

FIG. 1 shows a first embodiment of a high-range semiconductor load sensor device, designated as a whole by 1.

The load sensor device 1 includes a micromechanical sensing structure 2, integrated in at least one die of semiconductor material.

In this case, the micromechanical sensing structure 2 includes a first die 2a of semiconductor material, for example silicon, in which appropriate load-sensing elements 4 are integrated (illustrated schematically only in FIG. 1). The load-sensing element may be, for example, piezoresistive elements (in a way not illustrated in detail, in the first die 2a a membrane may be provided, suspended above a cavity, the piezoresistive elements being in this case formed in this membrane; alternatively, the piezoresistive elements may be formed in a surface portion of a monolithic body of the same first die 2a). The micromechanical sensing structure 2 also includes a second die 2b, arranged on the first die 2a, defining a cap and coupled to the top of the first die 2a, for example by a bonding layer 5 (in a way not illustrated, this bonding layer 5 may possibly define an empty space between the first and second dies 2a, 2b, for example in order to optimize stress detection via the sensitive elements integrated in the first die 2a).

Also the second die 2b may include or may be made of semiconductor material, for example silicon. It should moreover be noted, as on the other hand is mentioned hereinafter, that the presence of this second die 2b is in any case optional.

In the example shown, the first die 2a has a lateral extension (in a horizontal plane xy of main extension) greater than a corresponding extension of the second die 2b, so that there is a surface portion not covered by the second die 2b, where electrical contact pads 6 may be provided (electrically coupled to the load-sensing elements 4, for example, by conductive paths).

The load sensor device 1 further includes a package 10, which encloses the micromechanical sensing structure 2, thus providing a mechanical protective interface and an electrical connection interface in regard to the external environment. The package 10 may be defined as hermetic in so far as it is closed mechanically in regard to the external environment. This hermetic seal characteristic, however, depends on the material used for producing the package 10.

The package 10 is formed by a housing structure 12, configured to house the micromechanical sensing structure 2 within the same package 10, and a package coating 14, which coats the housing structure 12 (in this case, at the top, at the bottom, and at the sides), thus defining a top outer surface 10a, a bottom outer surface 10b, and external lateral surfaces 10c, 10d of the package 10, in contact with the external environment.

In greater detail, the housing structure 12 internally defines a cavity 15, within which the micromechanical sensing structure 2 is arranged, and includes: a supporting layer (or substrate) 16, which includes a base of the housing structure 12 and for the same cavity 15, on which the micromechanical sensing structure 2 is coupled (in this case, the first die 2a of the micromechanical sensing structure 2 is coupled, for example by adhesive material, to a top surface of the supporting layer 16, via a surface thereof not coupled to the second die 2b). The housing structure 12 also includes a washer-like lateral spacer element 18, which is coupled on the supporting layer 16, for example fixed to its top surface via gluing or soldering, surrounds the micromechanical sensing structure 2, and defines side walls of the cavity 15 (the lateral spacer element 18 has in the example a height, along a vertical axis z, orthogonal to the horizontal plane xy, substantially equal to the height of the micromechanical sensing structure 2). The housing structure 12 further includes a covering layer 19, provided for closing the cavity 15.

In greater detail, the covering layer 19 is thin (for example, with a thickness along the vertical axis z in the region of 100 µm) with respect to the height of the micromechanical sensing structure 2 and of the spacer element 18 and has high deformability and flexibility. An outer lateral portion of the covering layer 19 in this case is coupled in contact on the entire lateral spacer element 18, and moreover a central portion of the same covering layer 19 is coupled in contact on the micromechanical sensing structure 2 (in this case, on a surface of the second die 2b of the micromechanical sensing structure 2 not coupled to the first die 2a, having a lateral extension smaller than the central portion of the covering layer 19).

The covering layer 19 may be made of a thin film of Kapton (having a Young's modulus of 2.5 GPa) or Teflon, or of a thin metal layer, for example copper or steel. The covering layer 19 may be coupled with the lateral spacer element 18 via gluing or soldering.

The lateral spacer element 18 has in plane view (in the horizontal plane xy) the shape, for example, of a circular, square, rectangular, or generically polygonal ring, and may be made of metal material (steel or Invar, having a Young's modulus of 200 GPa, or else copper or Kovar), polysilicon, ceramic, or appropriate composite materials. In general, the lateral spacer element 18 is made of a material that is able to withstand high loads and has a high Young's modulus, for example of between 100 and 200 GPa. The Young's modulus of the lateral spacer element 18 is moreover comparable to that of the micromechanical sensing structure 2 (silicon has, in fact, a Young's modulus of 169 GPa).

The supporting layer 16 made be a so-called leadframe made of copper or other metal material, a multi-layer (for example obtained with LTCC technology, including a shaped thin ceramic layer on a copper substrate), or in any case include a layer of material the surface of which can be machined so as to define appropriate electrical routings.

In fact, the electrical contact pads 6 of the micromechanical sensing structure 2 are connected by electric wires 20 (with the so-called wire-bonding technique) to electrical-connection paths (not illustrated) provided on the surface of the supporting layer 16, which route the electrical signals towards external pads 21 provided in the same supporting layer 16, externally to the package coating 14, for electrical connection towards the external environment.

It should be noted that, in the case where the lateral spacer element 18 is made of conductive material, appropriate layers of insulating material (for example, Kapton) may be provided between the electrical-connection paths and the lateral spacer element 18.

The package coating 14 is provided by a moulding compound formed using techniques of injection moulding, for example of epoxy resin or another injection-mouldable material, e.g. techno-polymers such as PET (polyethylene terephthalate) or PPS (polyparaphenylene sulphide) possibly also reinforced with glass fibres. The package coating 14 encloses and protects the micromechanical sensing structure 2 and has a Young's modulus much lower (for example, by one or two orders of magnitude) than the Young's modulus of the micromechanical sensing structure 2 and of the lateral spacer element 18.

As will be clarified below, an aspect of the present solution envisages the housing structure 12 to have a thin deformable layer (in this case, the covering layer 19) interposed and in contact between the micromechanical sensing structure 2 and the package coating 14 and defining a mechanical-coupling interface between the micromechanical sensing structure 2 and the package coating 14. This deformable layer is configured to adapt (since it is sufficiently soft) to recover any possible vertical misalignments, in particular between the micromechanical sensing structure 2 and the lateral spacer element 18. In particular, the deformable layer is able to undergo deformation during injection into the mould of the compound that is to form the package coating 14, or in general during formation of the same package coating 14.

Moreover, according to a further aspect of the present solution, the load sensor device 1 is configured so that the materials, in the various cross-sections (parallel to the horizontal plane xy, at each height along the vertical axis z), are similar to one another and have mechanical characteristics that are generally uniform as regards the capacity of withstanding stresses (for example, in terms of the corresponding Young's modulus), so as to generate a uniform force distribution and prevent local force concentrations.

During operation, the load to be detected is applied from the outside on the load sensor device 1 through the package coating 14. By virtue of the properties of elasticity and of the low Young's modulus, the package coating 14 transfers the load onto the housing structure 12. In particular, the package coating 14 prevents (thanks to its elastic deformation) local concentrations of force that might jeopardise the sensing performance and reduce the maximum load applied. Advantageously, since the package coating 14 is obtained by moulding techniques, it has perfectly plane outer surfaces so as to guarantee uniform distribution of the applied load.

The covering layer 19 acts in this case as interface, or intermediate layer, between the package coating 14 and the micromechanical sensing structure 2 (in this case, the second die 2b), for transfer of the applied load.

Thanks to the characteristics of deformability and adaptability, the covering layer 19 provides a homogeneous contact with the lateral spacer element 18 and with the micromechanical sensing structure 2, even in the case where differences in height are present between the same micromechanical sensing structure 2 and lateral spacer element 18.

In particular, during coupling of the elements, the covering layer 19, by its deformation, is able to compensate any possible mechanical misalignments (of height in the vertical direction) between the micromechanical sensing structure 2 and the lateral spacer element 18. During the step of injection and formation of the package coating 14, deformation of the covering layer 19 enables a greater amount of injection material on the element set underneath. In addition, during the phase of load application, the recovery of the vertical misalignment via the injection material facilitates a more uniform distribution of the applied load (in a vertical direction) and effective homogeneous transfer of the same load.

Moreover, during application of the load, the lateral spacer element 18 advantageously enables decoupling of possible lateral stresses from the micromechanical sensing structure 2, enabling use of the load sensor device 1 also for measuring the pressure of a fluid, hence in hydrostatic conditions. Another advantage of this solution is the possibility of decoupling possible mechanical stresses acting in the horizontal plane xy when the load sensor device 1 is used as sensor for detecting a force applied along the vertical axis z.

Figure 2:
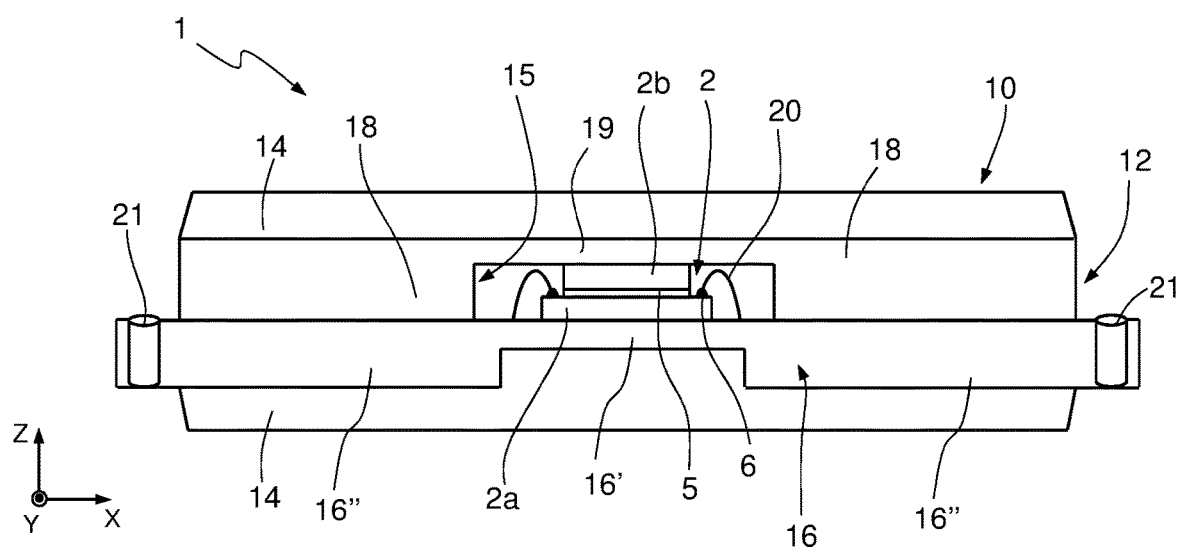
FIGS. 2-10 show cross-sections of a high-range semiconductor load sensor device, according to further embodiments of the present solution.

FIG. 2 shows a different embodiment of the sensor device 1 (it should be noted that, for clarity of exposition, hereinafter only the differences from the first embodiment are described), where in the housing structure 12, the spacer element 18 and the covering layer 19 are made of a single piece, i.e., in one and the same body of material, for example of copper or steel (or, alternatively, Invar, Kovar, polysilicon, ceramic or other composite material capable of withstanding high stresses, as discussed previously). This body of material may, for example, be subjected to removal of material for definition of the cavity 15 and simultaneously for the formation of the covering layer 19, in this case formed by a thin surface portion of the body of material.

A covering layer 19 obtained in this way may be advantageous in so far as it prevents the need to couple distinct materials, and generation of stresses that might be caused by the different coefficients of thermal expansion of the same materials.

Moreover, in this embodiment, the supporting layer 16 of the housing structure 12 has a central portion 16', vertically corresponding to the cavity 15, that is thinned out, having a smaller thickness than lateral portions 16" of the same supporting layer 16. The micromechanical sensing structure 2 is coupled to this central portion 16' of the supporting layer 16.

The supporting layer 16 may be formed by a rigid-flexible printed circuit board (PCB), i.e., one provided with a rigid portion (defining the lateral portions 16" of the supporting layer 16) and a flexible portion (defining the central portion 16' of the same supporting layer 16); for example, the central portion 16' is made of Kapton, whereas the lateral portions 16" are made of FR4 (having a Young's modulus of 22 GPa, in any case much lower than the Young's modulus of silicon).

In this embodiment, it is hence the supporting layer 16, with its central portion 16', that defines the deformable layer in contact with the micromechanical sensing structure 2, defining the mechanical-coupling interface between the micromechanical sensing structure 2 and the package coating 14 (enabling, as previously discussed, compensation of any possible misalignments and uniform distribution of the applied load).

Moreover, in this case, the package coating 14 covers at the top and at the bottom, but not laterally, the housing structure 12, which hence contributes to defining, through the spacer element 18, the external lateral surfaces 10c, 10d of the package 10, in contact with the external environment.

Figure 3:
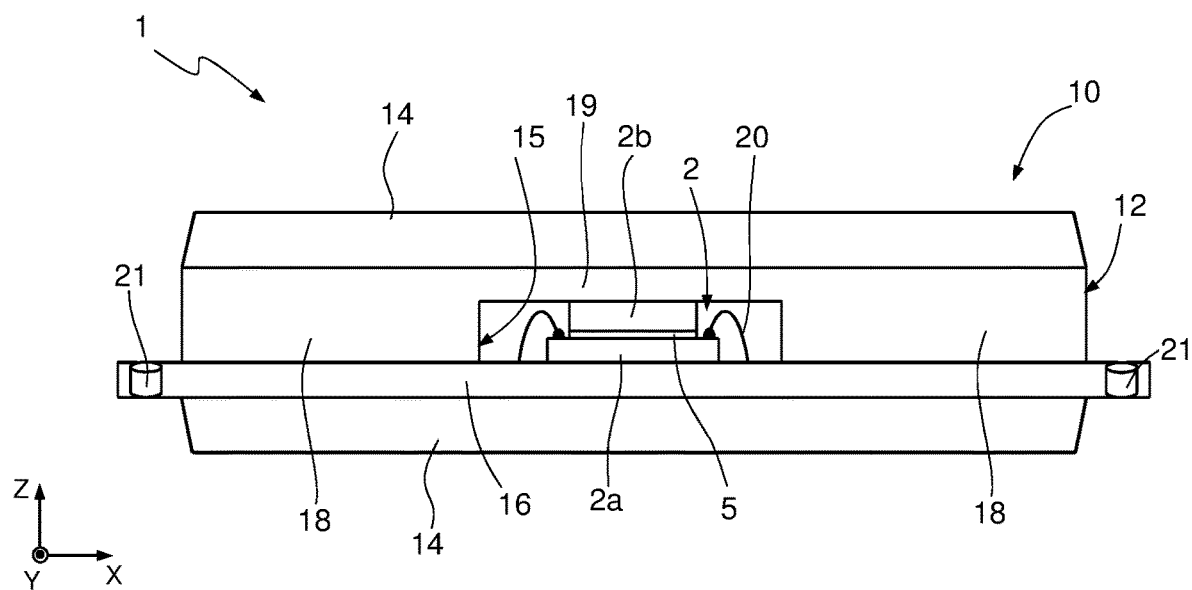

As shown in FIG. 3, a further embodiment of the sensor device 1 differs from the one illustrated with reference to FIG. 2 in that the supporting layer 16 of the housing structure 12 is provided by a single continuous thin layer of flexible material, for example Kapton, hence defining as a whole the deformable layer in contact with the micromechanical sensing structure 2.

Alternatively, once again with reference to FIG. 3, if the supporting layer 16 is made of a harder material (e.g., a ceramic or FR4), recovery of the tolerances along the vertical axis z may be obtained once again via deformation of the covering layer 19, if this is sufficiently thin (for example, with a thickness of 100 μm), or by a combination of supporting layer 16 and covering layer 19.

Figure 4:
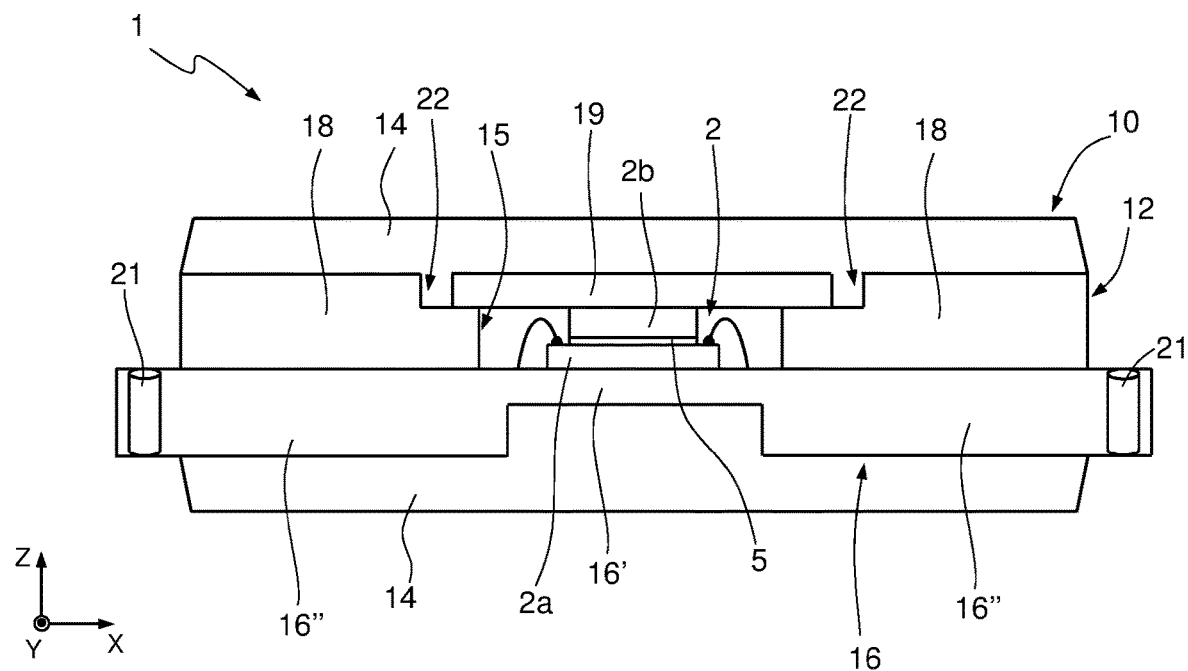

In a further embodiment, illustrated in FIG. 4, the covering layer 19, once again provided for closing the cavity 15 in which the micromechanical sensing structure 2 is housed, has a lateral extension (in the horizontal plane xy) slightly greater than the cavity 15 and is coupled to indentations (or recesses) 22, which are provided in a surface portion of the lateral spacer element 18 and are arranged internally and in a position corresponding to the cavity 15. This embodiment may enable formation of the indentations 22 so as to recover possible differences in height of the lateral spacer element 18 and of the micromechanical sensing structure 2.

Also in this embodiment, the supporting layer 16, with its central portion 16', defines the deformable layer in contact with the micromechanical sensing structure 2, contributing in any case to recovering possible further misalignments, which anyway are of a limited extent.

Figure 5:
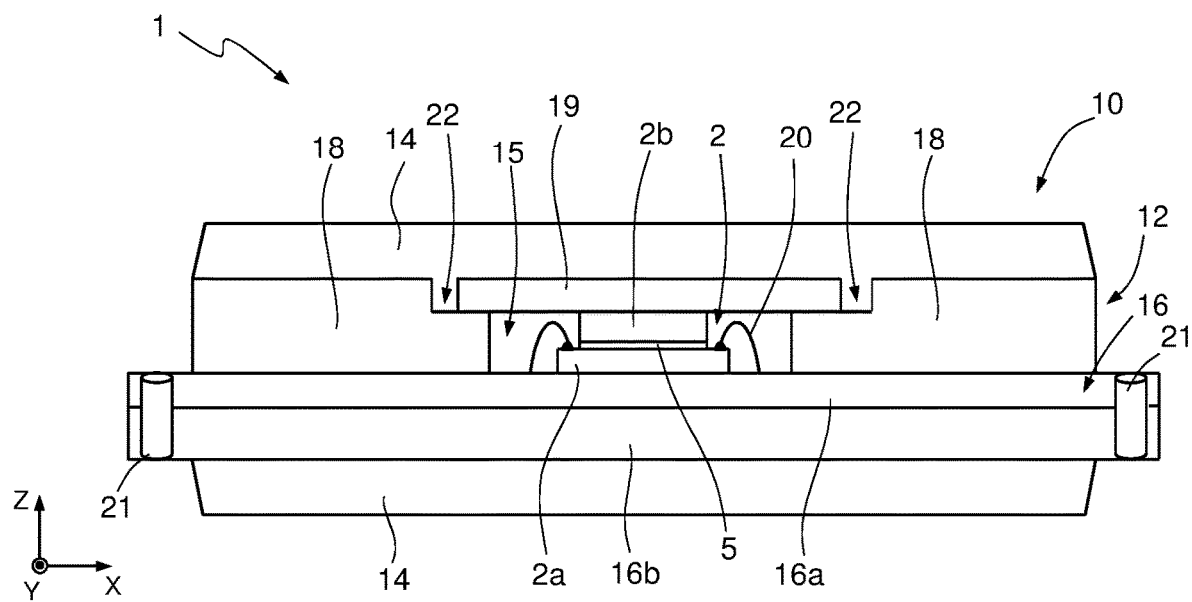

As illustrated in FIG. 5, in yet a further embodiment, the supporting layer 16 includes: a multi-layer structure made up of a first thin and continuous layer of flexible material, for example Kapton, designated by 16a, coupled to which is the micromechanical sensing structure 2; and a second underlying thicker and more rigid layer, designated by 16b, made for example of FR4.

In this case, recovery of the height tolerance is once again provided via: the appropriate indentations 22, formed at the same height as the micromechanical sensing structure 2; the covering layer 19, in the case where it is sufficiently thin (for example, with a thickness of 100 μm); and moreover the contribution of the supporting layer 16 (by its first layer 16a and, in part, its second layer 16b, given that they both have a Young's modulus much lower than that of the spacer element 18 and the micromechanical sensing structure 2).

Figure 6:
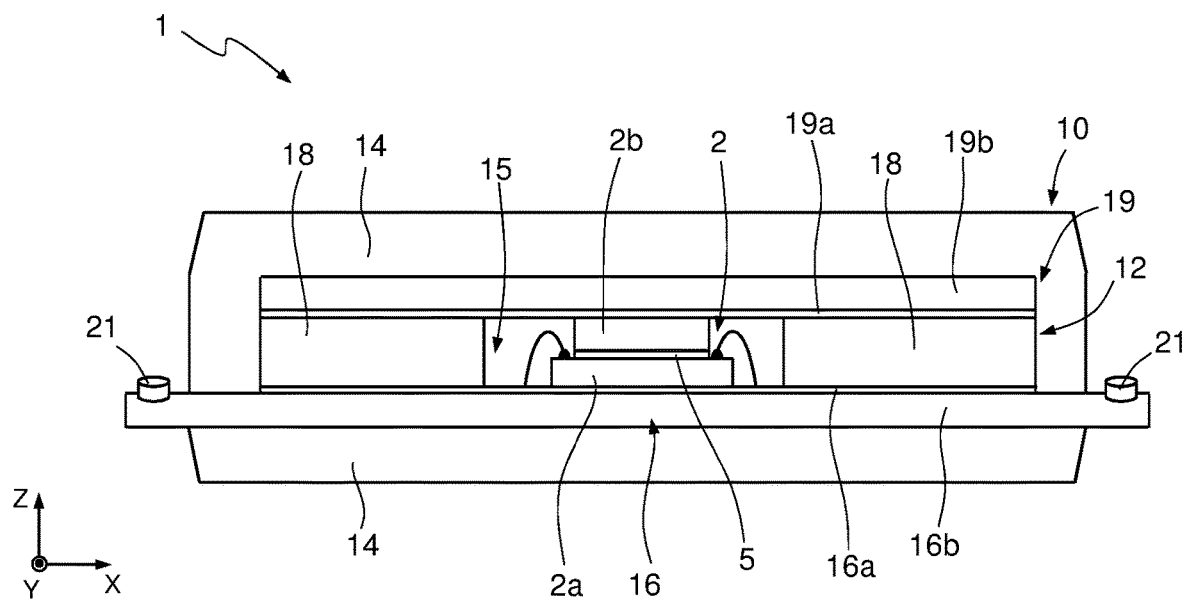

As illustrated in FIG. 6, a further embodiment envisages that also the covering layer 19 provided for closing the cavity 15 is of a multi-layer type, in this case made up of a first layer 19a, constituted by a thin layer of elastic material (for example, Kapton), on which a second, thicker, layer 19b, for example of copper (both materials being softer than the spacer element 18) is arranged.

In this embodiment, both the covering layer 19 (in particular, the corresponding first layer 19a) and the supporting layer 16 (in particular, the corresponding first layer 16a) define a deformable layer in contact with the micromechanical sensing structure 2, jointly contributing to recovery of the tolerances.

It should be noted that in the above embodiment, by way of example, once again the package coating 14 coats the housing structure 12 at the top, at the bottom, and also at the sides.

Figure 7:
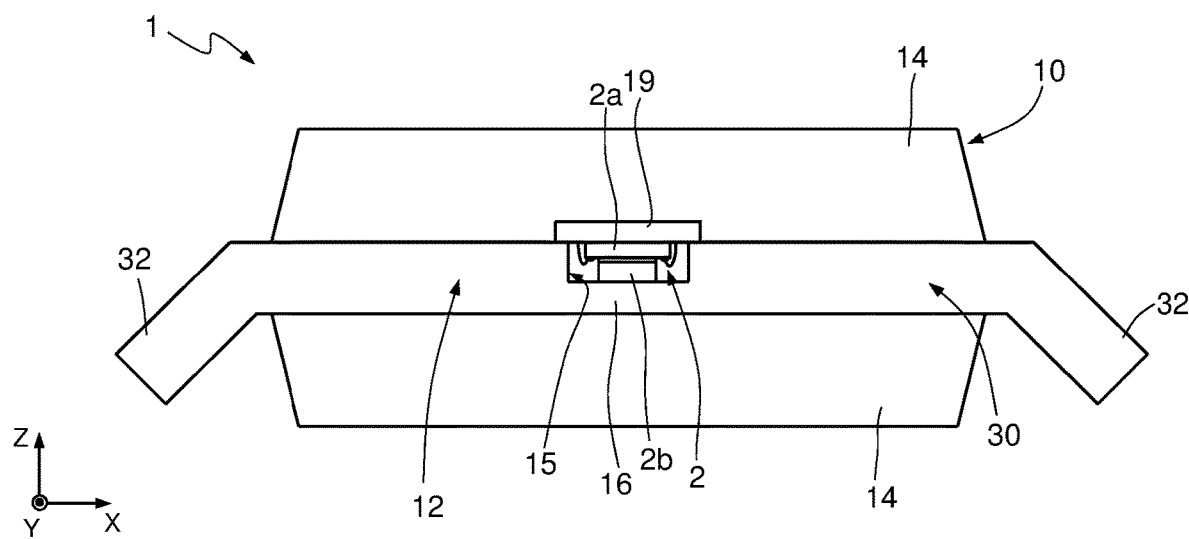

With reference to FIG. 7, a further embodiment of the present solution is now illustrated.

In this case, the housing structure 12 inside the package 10 is formed, in part, by a frame (the so-called leadframe) 30, made of appropriate material, for example metal (copper, Invar, Kovar, etc.), polysilicon, or a ceramic or composite material, which is etched to form inside it the cavity 15 in which the micromechanical sensing structure 2 is housed.

Basically, the leadframe 30 in this case defines the supporting layer 16, by a bottom portion thereof, and the spacer element 18, by its lateral portions, which extend, for example, in a way similar to so-called DIPs (Dual-In-Line Packages), to form external pins 32, arranged externally with respect to the package coating 14, for electrical connection towards the outside.

The covering layer 19, provided for closing the cavity 15, is instead in this case distinct from the leadframe 30, has a lateral extension slightly greater than that of the cavity 15 and is coupled to a top portion of the spacer element 18 formed in the leadframe 30, thus being enclosed in the package coating 14.

It should be noted that, in this embodiment, the micromechanical sensing structure 2 is set upside down within the cavity 15, with the first die 2a that is set in contact with the covering layer 19, to which it is moreover electrically coupled by the electric wires 20. The second die 2b, the cap die, is instead coupled in contact with the supporting layer 16. In a way not illustrated, appropriate electrical routings are hence provided through the elastic covering layer 19 and the leadframe 30, for transmitting the electrical signals transduced by the micromechanical sensing structure 2 towards the external pins 32.

In this embodiment, it is once again the covering layer 19, made of a material having low Young's modulus, that defines the deformable layer as interface between the micromechanical sensing structure 2 and the package coating 14.

Figure 8:
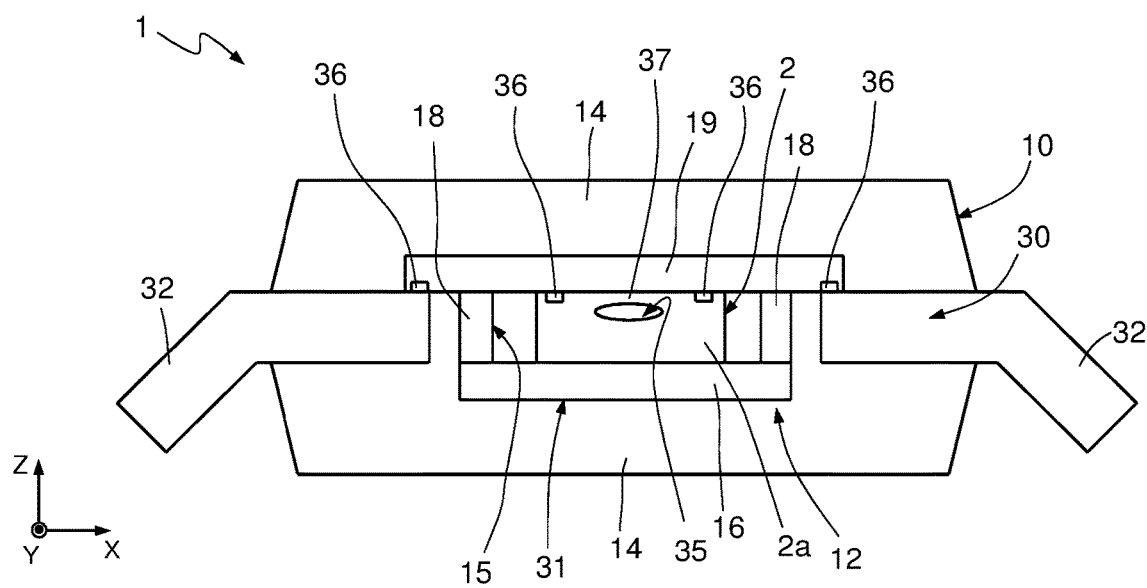

FIG. 8 shows yet a further embodiment of the present solution.

Also in this case, as in the previous embodiment, the housing structure 12 in the package 10 is provided inside the leadframe 30 of the package 10, which, in this embodiment, is, however, "truncated", with the presence of an internal block 31 of the same leadframe 30, separate from the outer portion of the leadframe 30 that is coupled to the external pins 32.

In particular, the internal block 31 is defined by the supporting layer 16, which is, for example, made of Kapton, by the spacer element 18, and by the covering layer 19, which is, for example, also made of Kapton, being appropriately coupled to one another to form the cavity 15, sealed with respect to the package coating 14.

Appropriate electrical-connection elements 36 are in this case provided between the micromechanical sensing structure 2, the covering layer 19, and the outer portion of the leadframe 30 coupled to the external pins 32.

In this embodiment, both the covering layer 19 and the supporting layer 16, which are both made of deformable material with a low Young's modulus, contribute to recovery of the tolerances.

It should be noted that, by way of example, the micromechanical sensing structure 2 includes, in this embodiment, a sensing cavity 35, formed in the first die 2a, and a sensing membrane 37, suspended above the sensing cavity 35. In this case, the cap formed in the second die 2b (here absent) is not envisaged. The sensor structure is to be understood in any case as purely indicative, and hence also in this embodiment a sensor may be used like the one described in the previous embodiments (i.e., without the membrane and with the second cap die 2b).

Figure 9:
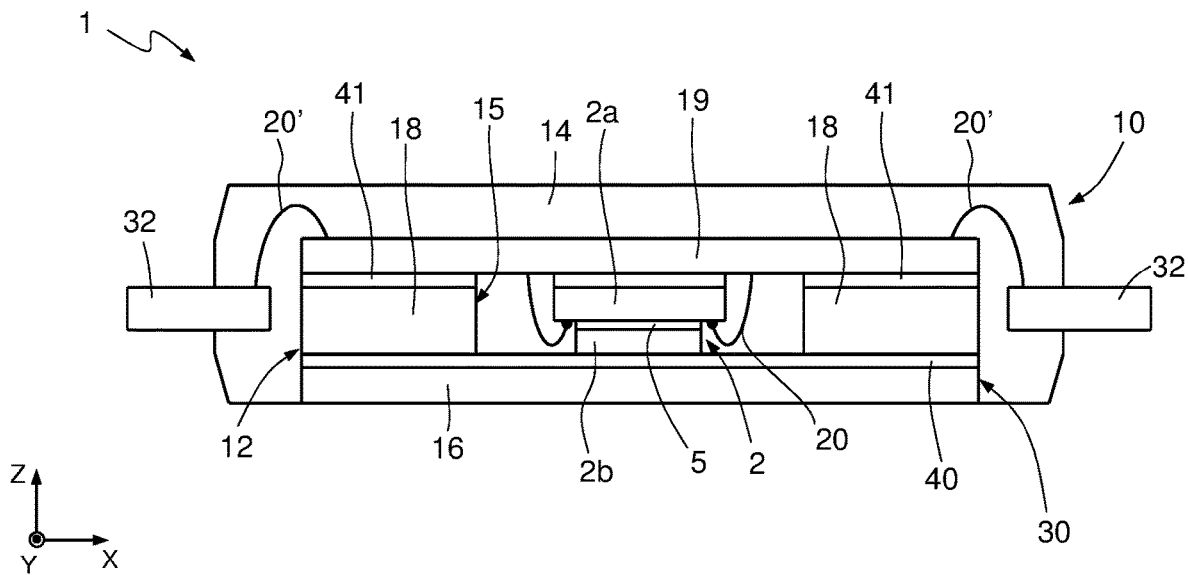

In the embodiment illustrated in FIG. 9, the leadframe of the package 10, once again designated by 30, forms part of the bottom surface of the same package 10, being set at a lower height than the external pins 32. The package coating 14 in this case hence does not cover the housing structure 12 underneath (but only on top and at the sides).

The leadframe 30 includes the supporting layer 16 of the housing structure 12, to which the spacer element 18, for example made of copper, is coupled by a bonding layer 40, for example made of epoxy resin. The covering layer 19 is, in this case, coupled to the spacer element 18 and to the micromechanical structure 2 by a respective bonding layer 41, which is also made of epoxy resin.

Also in this embodiment, the micromechanical sensing structure 2 is arranged upside down within the cavity 15, with the first die 2a that is coupled, by the , bonding layer 41, to the covering layer 19, to which it is moreover electrically coupled by the electric wires 20. The second cap die 2b is, instead, coupled to the supporting layer 16 by the bonding layer 40. In a way not illustrated, appropriate electrical routings are in this case provided through the elastic covering layer 19, for transmitting the electrical signals transduced by the micromechanical sensing structure 2 towards the external pins 32, via further electric wires 20'.

In this embodiment, both the covering layer 19 and the supporting layer 16, which are both made of deformable material with low Young's modulus, contribute to recovery of tolerances.

Figure 10:
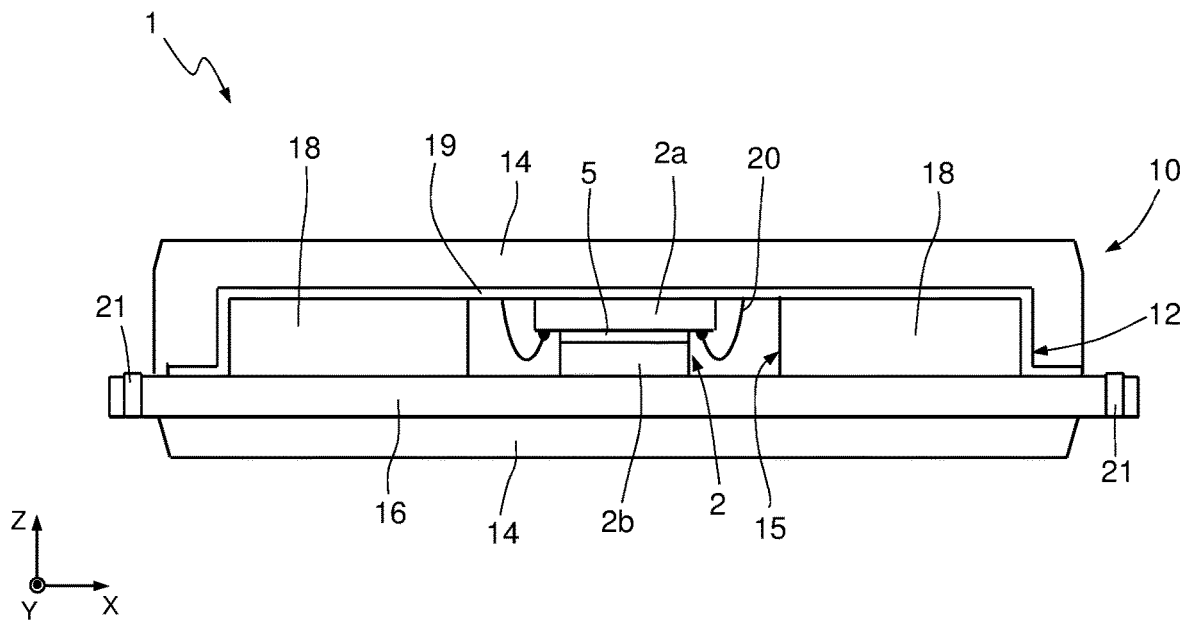

As illustrated in FIG. 10, in a further embodiment of the present solution, the covering layer 19 moreover extends laterally in contact with the spacer element 18, and in part above the supporting layer 16, and defines appropriate electrical routings for the signals transduced by the micromechanical sensing structure 2, towards the external pads 21 of the package 10.

Also in this case, the micromechanical structure 2 is arranged upside down within the cavity 15, in a way substantially similar to the one illustrated with reference to the previous embodiment.

The covering layer 19 is, for example, made of Kapton or other similar flexible and conductive material, thus defining the deformable layer that operates as an interface between the micromechanical sensing structure 2 and the package coating 14.

The advantages of the present solution emerge clearly from the foregoing description.

In any case, it is underlined that the solution described enables a good protection in regard to the external environment, obtained by a dual level of protection, afforded by the package coating 14 that covers the further protection structure formed by the housing structure 12 that defines the cavity 15 in which the micromechanical sensing structure 2 is housed. In particular, in this way, any external contaminants, for example chemical agents, humidity, fluids, or other contaminating agents, are prevented from coming into contact with the electrical contact pads 6 and the electric wires 20 of the micromechanical sensing structure 2 (i.e., the corresponding "electronic" elements). The package 10 is hermetic in the case where at least one of the levels of protection is provided with hermetically sealing material.

Moreover, the package 10 has a high mechanical reliability given that any local stress concentrations are prevented, thanks to the use of an interface material towards the external environment having a low Young's modulus.

As mentioned previously, the solution described enables recovery of possible misalignments in a vertical direction between the elements of the structure, thanks to the use of an appropriate deformable layer as mechanical-coupling interface between the package coating 14, which is made of mouldable and conformable material, and the die/dies of the micromechanical sensing structure 2.

Moreover, use of the spacer element 18 of the housing structure 12 advantageously enables elimination of possible stresses that might otherwise act in a lateral direction on the micromechanical sensing structure 2.

The solution described is moreover easy to manufacture with low production costs, using substantially traditional packaging techniques, in particular with the use of mouldable materials for production of the package 10.

It should moreover be noted that in all the embodiments described the cross sections of the structure of the package 10 have mechanical characteristics that are uniform as regards, for example, the characteristics of elasticity of the materials used, thus contributing to the uniformity of application of the load on the micromechanical sensing structure 2. In any case preferable are the embodiments that envisage the use, along one and the same line of cross section, of one and the same uniform material, or of similar materials or materials with mechanical characteristics that are identical or as similar as possible.

The characteristics highlighted render in any case particularly recommended the use of the sensor device 1 in an electromechanical braking system.

Figure 11:
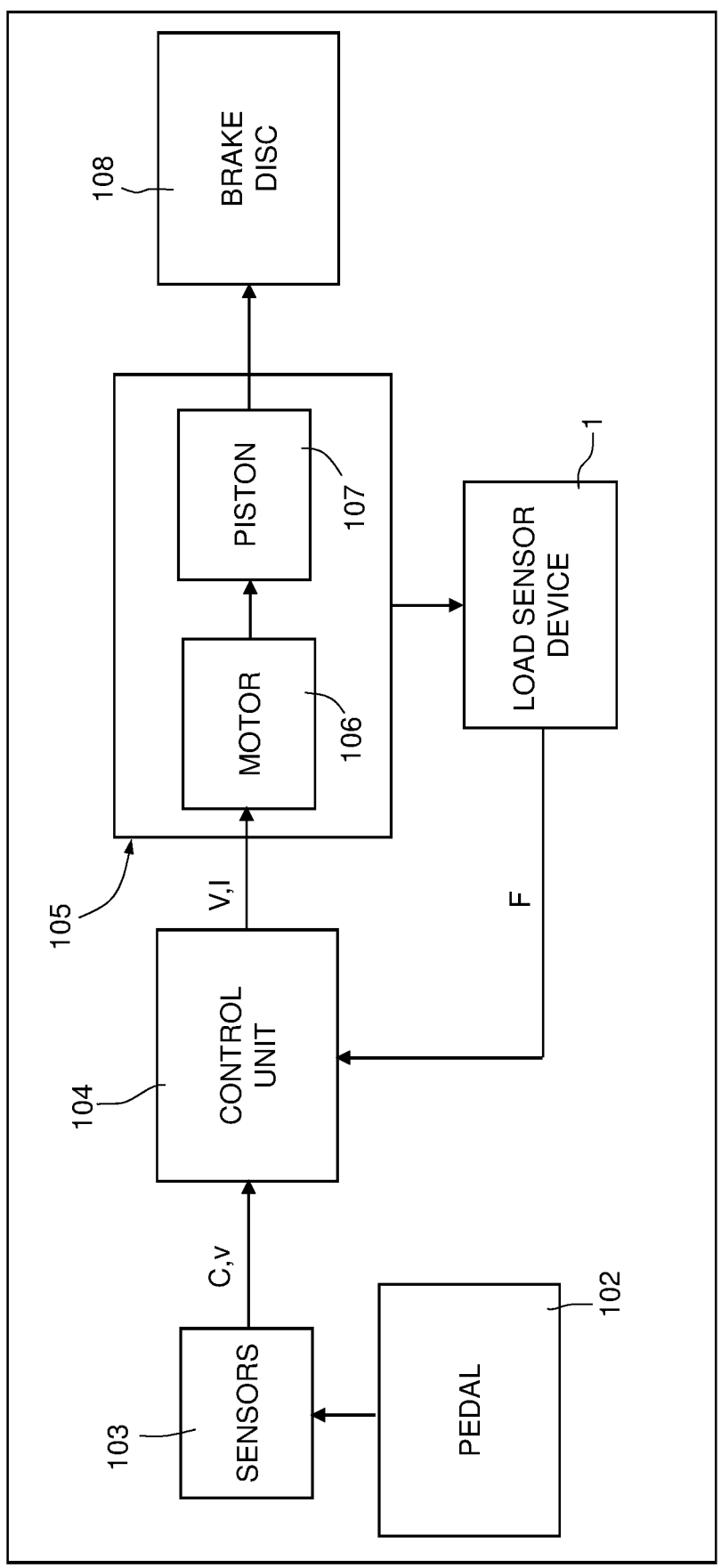
FIG. 11 shows a block diagram of an electromechanical braking system incorporating a load sensor device according to the present solution.

In this regard, FIG. 11 shows an exemplary general block diagram of a braking system 100 of an electromechanical type, which includes one or more sensor devices according to any one of the embodiments described previously.

In particular, the braking system 100 further includes: a brake pedal 102; further sensors 103 adapted to detect the stroke C and speed v of actuation of the brake pedal 102; and an electronic control unit 104, connected to the further sensors 103. The braking system 100 additionally includes an electromechanical actuator 105 connected to the electronic control unit 104, and an electric motor 106 and a piston 107 coupled to the electric motor 106, for example by a connection element of the worm-screw type (not illustrated). Also included in the braking system 100 is a brake disk 108, connected to the electromechanical actuator 105 and fixed with respect to a wheel of a vehicle (in a way known and not illustrated).

The one or more sensor devices 1 according to some embodiments are configured to detect information regarding the braking action exerted by the electromechanical actuator 105 on the brake disk 108, and are feedback-connected to the electronic control unit 104.

In use, the further sensors 103 send data on the stroke C and the speed v of actuation of the brake pedal 102 to the electronic control unit 104, which, as a function of these data, generates a control signal (a voltage signal V or a current signal I) for the electromechanical actuator 105 (in particular, for the electric motor 106). As a function of the control signal, the electric motor 106 generates a torque, which is transformed into a linear movement of the piston 107 by the worm-screw connection element. Consequently, the piston 107 presses on the brake disk 108 (via pads of abrasive material, not illustrated) so as to brake rotation thereof. The sensor device or devices 1, positioned in series with respect to the pads, detects/detect the value of the load (in particular, the force F with which the pads of the brake are pressed on the disk) exerted by the piston 107 on the brake disk 108, and feeds the transduced signals back to the electronic control unit 104. The electronic control unit 104 exerts in this way a closed-loop control (for example, a PID—Proportional-Integral-Derivative) control of the braking action.

According to an embodiment, the sensor device or devices 1 is/are housed in a casing of the electromechanical actuator 105 so as to be sensitive to the force F exerted by the piston 107. Alternatively, the sensor device or devices 1 is/are housed in the hydraulic circuit of the braking system, for directly measuring the pressure of the fluid.

Finally, it is clear that modifications and variations may be made to what has been described and illustrated herein, without thereby departing from the scope of the present disclosure.

In particular, it is emphasised that the embodiments described previously could be combined together to obtain further variant embodiments of the present solution, as on the other hand will emerge clearly from the foregoing exposition.

The further sensors 103 (FIG. 11) could include a sensor for measuring the force with which the brake pedal is pressed.

It is moreover evident that other applications are possible for the sensor device 1, in general for providing force sensors for high loads (100 kg, 1 t, 10 t, or higher loads), for example for people weighing-machines, or else industrial weighing-machines for weighing loads (for example, heavy-load vehicles), etc.

In addition, the sensor device 1 may be used in the industrial field, for monitoring components and specific parts of pressurised circuits (robot arms, etc.), or else in air-conditioning systems, or in other applications still in which it is expedient to measure/monitor a level of pressure of a fluid and/or of a gas, in particular having high values (for example, values higher than or equal to 30 MPa), or other kinds of loads, with a high range.

What is claimed is:
1. A device, comprising:
  a micromechanical sensing structure configured to provide an electrical detection quantity as a function of a load, the micromechanical sensing structure comprising a first die comprising a semiconductor material, the first die comprising sensing elements integrated in the first die for sensing the load; and
  a package enclosing the micromechanical sensing structure and providing a mechanical and electrical interface with respect to an external environment, wherein the package comprises:

a housing structure comprising a cavity, the first die disposed within the cavity and leaving a residual cavity laterally surrounding the first die; and a package coating that coats, at least in part, the housing structure, the package coating comprising a mechanical interface configured to transfer, in a uniform manner, the load on the housing structure and on the micromechanical sensing structure, wherein the housing structure comprises a deformable layer interposed and in contact between the micromechanical sensing structure and the package coating, and wherein the deformable layer completely closes the cavity at a top surface of the cavity facing away from the micromechanical sensing structure, and defines a mechanical-coupling interface.

2. The device according to claim 1, wherein the housing structure further comprises:

a covering layer that closes the cavity at a top surface and is in contact with the micromechanical sensing structure;

a spacer element surrounding the micromechanical sensing structure and defining side walls of the cavity; and a supporting layer, defining a base of the cavity, the micromechanical sensing structure being disposed on and in contact with the supporting layer, wherein the deformable layer is defined by the covering layer, the supporting layer, or both the covering layer and the supporting layer.

3. The device according to claim 2, wherein the deformable layer is in contact with the spacer element and with the micromechanical sensing structure and comprises a material having a Young's modulus lower than that of a material of the spacer element and of the micromechanical sensing structure.

4. The device according to claim 2, wherein the package coating comprises an injection-moldable material having a Young's modulus lower than that of a material of the spacer element and of the micromechanical sensing structure.

5. The device according to claim 2, wherein the spacer element has, in a plan view, a ring shape and comprises a material having a Young's modulus higher than a Young's modulus of the package coating and of the deformable layer.

6. The device according to claim 2, wherein the covering layer defines the deformable layer and has a thickness, in a direction transverse to a main plane of extension, smaller than a thickness of the spacer element.

7. The device according to claim 6, wherein the package further comprises a frame, within which the cavity is etched and which defines the housing structure.

8. The device according to claim 7, wherein the covering layer couples to a top portion of the frame in a position corresponding to the cavity.

9. The device according to claim 2, wherein the supporting layer defines the deformable layer and comprises a central portion and lateral portions, the central portion being arranged vertically in a position corresponding to the cavity and being coupled to the micromechanical sensing structure.

10. The device according to claim 9, wherein the central portion has a smaller thickness than the lateral portions.

11. The device according to claim 10, wherein the lateral portions extend at least in part on the outside of the package coating, and electrical-contact elements are coupled to the lateral portions and externally with respect to the package coating.

12. The device according to claim 10, wherein the supporting layer comprises a continuous layer of flexible material.

13. The device according to claim 10, wherein the supporting layer is a multi-layer supporting layer comprising a layer of flexible material and an underlying rigid layer, wherein the micromechanical sensing structure is coupled to the layer of flexible material.

14. The device according to claim 2, wherein the supporting layer defines a bottom portion of the package facing the external environment.

15. The device according to claim 1, wherein the deformable layer comprises a main extension in a horizontal plane, and wherein, in cross sections parallel to the horizontal plane, materials comprised in the package have uniform mechanical characteristics with regards to a corresponding Young's modulus, to generate a uniform distribution of force, and prevent local concentrations thereof.

16. A system, comprising:

a semiconductor load sensor device comprising:

a micromechanical sensing structure configured to provide an electrical detection quantity as a function of a load, the micromechanical sensing structure comprising a first die comprising a semiconductor material, the first die comprising sensing elements integrated in the first die for sensing the load; and a package enclosing the micromechanical sensing structure and providing a mechanical and electrical interface with respect to an external environment, wherein the package comprises:

a housing structure comprising a cavity, the first die disposed within the cavity and leaving a residual cavity laterally surrounding the first die, the housing structure further comprising a covering layer that completely closes the cavity at a top surface of the cavity facing away from the micromechanical sensing structure and is in contact with the micromechanical sensing structure; and a package coating that coats, at least in part, the housing structure and is in contact with a top surface of the covering layer, the package coating comprising a mechanical interface configured to transfer, in a uniform manner, the load on the housing structure and on the micromechanical sensing structure, wherein the housing structure comprises a deformable layer interposed and in contact between the micromechanical sensing structure and the package coating, and wherein the deformable layer defines a mechanical-coupling interface, the system being a braking system for vehicles, comprising at least one brake disk, an electromechanical actuator configured to exert a braking action on the brake disk, and a control unit configured to exert a control of the braking action based on an electrical quantity transduced by the semiconductor load sensor device, indicative of the load applied on the brake disk by the electromechanical actuator.

17. The system according to claim 16, wherein the housing structure further comprises:

a spacer element surrounding the micromechanical sensing structure and defining side walls of the cavity; and a supporting layer, defining a base of the cavity, the micromechanical sensing structure being disposed on and in contact with the supporting layer, wherein the deformable layer is defined by the covering layer, the supporting layer, or both the covering layer and the supporting layer.

18. The system according to claim 16, wherein the deformable layer comprises a main extension in a horizontal plane, and wherein, in cross sections parallel to the horizontal plane, materials comprised in the package have uniform mechanical characteristics with regards to a corresponding Young's modulus, to generate a uniform distribution of force, and prevent local concentrations thereof.

19. A device, comprising:
- a first semiconductor die configured to provide an electrical detection quantity as a function of a load;
- a substrate supporting the first semiconductor die;
- a package disposed around the first semiconductor die and providing a hermetic sealing to the first semiconductor die, wherein the package comprises:
  - a housing structure comprising a cavity, the first semiconductor die disposed within the cavity;
  - a package coating that coats, at least in part, the housing structure, the package coating comprising a mechanical interface configured to transfer, in a uniform manner, the load on the housing structure and on the first semiconductor die;
  - a deformable layer interposed and in contact between the first semiconductor die and the package coating, the deformable layer completely closing the cavity at a top surface of the cavity facing away from the micromechanical sensing structure and defining a mechanical-coupling interface; and
  - a spacer element disposed laterally from the first semiconductor die in the cavity, the spacer element having a same height as the cavity, the spacer element being different from the deformable layer, the package coating, and the substrate.

20. The device according to claim 19, wherein the housing structure laterally encloses the spacer element, the spacer element being different from the housing structure and disposed over the substrate.

* * * * *